(12) United States Patent
Sridhara et al.

(10) Patent No.: US 8,943,384 B2
(45) Date of Patent: Jan. 27, 2015

(54) USING A SOFT DECODER WITH HARD DATA

(75) Inventors: Deepak Sridhara, Boulder, CO (US); Arvind Sridharan, Longmont, CO (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 156 days.

(21) Appl. No.: 13/445,591

(22) Filed: Apr. 12, 2012

(65) Prior Publication Data

US 2013/0275829 A1 Oct. 17, 2013

(51) Int. Cl.
*G11C 29/00* (2006.01)
*H03M 13/00* (2006.01)

(52) U.S. Cl.
USPC .......................................... 714/763; 714/755

(58) Field of Classification Search
CPC .......... G06F 11/1048; H03M 13/1111; H03M 13/2957; H03M 13/6325; H03M 13/6577; H03M 13/6511; H03M 13/3707; G11C 11/5642
See application file for complete search history.

(56) References Cited

U.S. PATENT DOCUMENTS

| | | | |
|---|---|---|---|
| 2008/0109703 A1* | 5/2008 | Brandman | 714/763 |
| 2009/0222710 A1 | 9/2009 | Patapoutian et al. | |
| 2009/0245372 A1 | 10/2009 | Yamasaki | |
| 2010/0131809 A1* | 5/2010 | Katz | 714/719 |
| 2011/0246859 A1* | 10/2011 | Haratsch et al. | 714/773 |
| 2011/0305082 A1* | 12/2011 | Haratsch et al. | 365/185.03 |
| 2012/0224421 A1* | 9/2012 | Litsyn et al. | 365/185.03 |
| 2012/0236638 A1* | 9/2012 | Weingarten et al. | 365/185.2 |
| 2013/0024743 A1* | 1/2013 | Sharon et al. | 714/763 |
| 2013/0094298 A1* | 4/2013 | Vigoda et al. | 365/185.18 |
| 2013/0121084 A1* | 5/2013 | Jeon et al. | 365/185.24 |

FOREIGN PATENT DOCUMENTS

WO WO2011116831 9/2011

* cited by examiner

*Primary Examiner* — Guerrier Merant
(74) *Attorney, Agent, or Firm* — Hollingsworth Davis, LLC

(57) ABSTRACT

A method for re-using a soft decoder involves receiving soft data and hard data from memory cells in a memory device, mapping the soft data to a first set of soft information, mapping the hard data to a second set of soft information, and using the soft decoder to decode both the first set and second set of soft information.

15 Claims, 8 Drawing Sheets

USING A SOFT DECODER WITH HARD DATA

SUMMARY

Various embodiments described herein are generally directed to methods, systems, and apparatuses that decode soft data using a soft decoder and re-use the same soft decoder to decode hard data, wherein both hard and soft data are received from memory cells in a memory device. In one embodiment, a method for re-using a soft decoder involves receiving soft data and hard data from memory cells in a memory device, mapping the soft data to a first set of soft information, mapping the hard data to a second set of soft information, and re-using the same soft decoder to decode the first set and second set of soft information.

In another embodiment, a method for re-using a soft decoder involves receiving soft data and hard data from a multi-bit MLC (multi-level cell) in a memory device, the hard data is read sequentially or randomly from multiple logical pages of the multi-bit MLC. The method also includes mapping the soft data to a first set of soft information, mapping the hard data to a second set of soft information, and re-using the same soft decoder to decode the first set and second set of soft information.

In accordance with various embodiments, an apparatus comprises a memory device including memory cells, a read sensor configured to receive soft data and hard data from the memory cells, a demodulator and a decoder. The demodulator is configured to map the soft data to a first set of soft information, and map the hard data to a second set of soft information. The decoder is configured to decode the first set and second set of soft information.

These and other features and aspects of various embodiments may be understood in view of the following detailed discussion and accompanying drawings.

DETAILED DESCRIPTION

Figure 1:
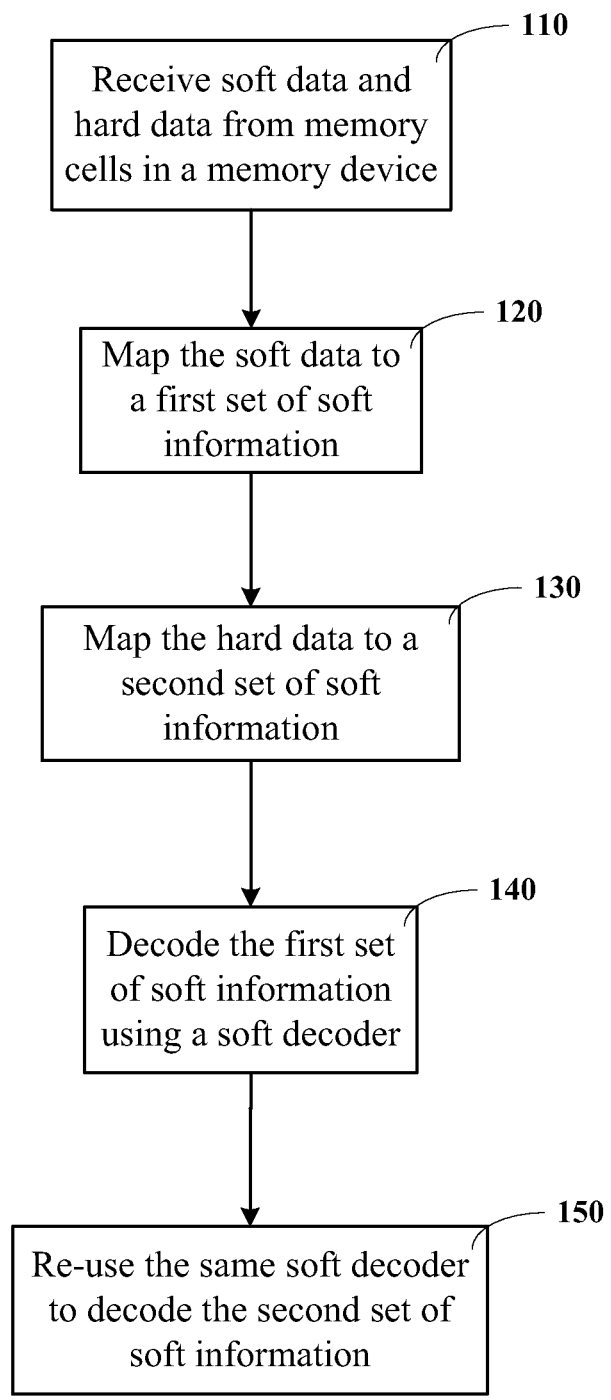
FIG. 1 illustrates various processes for re-using a soft decoder to decode hard data in a memory device in accordance with various embodiments.

Memory devices may comprise single-level memory cells or multi-level memory cells. Single level cell (SLC) memory uses memory cells that store one bit of data per cell. Data is read from the SLC by sensing the voltage of the memory cell and comparing the sensed voltage to a reference voltage. If the sensed voltage is greater than the reference voltage, it is determined that the bit is in a first state, e.g., the "0" state, and if the sensed voltage is less than the reference voltage, it is determined that the bit is in a second state, e.g., the "1" state. In multi-level cell (MLC) memory, the memory cells can be programmed to store two or more bits of information. For example, a two bit MLC is capable of storing four two bit symbols, 00, 01, 10, 11, each symbol corresponding to a different voltage level stored in the memory cell. While specific examples below are illustrated as two-bit-per-cell memory, it is not intended that the concepts and embodiments described herein be solely limited to this type of memory. For example, MLC may refer to any number of multiple bits per cell.

In memory devices, such as a solid state drive (SSD) or flash drive, a read sensor is used to read/sense voltage levels on a memory cell. In some cases, a memory cell is read only once per read operation. A single read produces a bit of information, the bit of information may be a 1 or a 0, and no confidence information is deduced from a single read. The single bit data is denoted hard data. With hard data, typically a hard decision decoder has been used to decode the data. In some implementations, a soft decision decoder is used to decode both hard and soft data. For example, the soft decision decoder may comprise a soft decision low density parity check (LDPC) decoder. Embodiments described herein involve converting the hard data into soft-information, e.g., in the form of log-likelihood ratios (LLRs) and then decoding the converted hard data. In some cases, a memory system can include a soft-decision LDPC decoder with no hard decision decoder. The hard data is decoded using the soft-decision LDPC decoder, thereby saving area and cost that would be needed to implement a separate hard-decision decoder. Soft information can be used by some types of soft decision decoders, e.g., LDPC decoders, and provides a measure on the reliability of a bit being a "0" or a "1". An LLR represents the bit read from the memory cell along with confidence information. The LLR can be developed either analytically (based on a noise distribution) or more generally by a look up table.

Furthermore, using prior information on the signal levels of the SLC/MLC flash device, the mapping of hard data into soft LLR information can be enhanced, thereby enhancing the resulting soft LDPC decoder performance. We also propose optimizing the programmable bias and scaling parameters in the existing soft LDPC decoder to further optimize the soft decoder performance.

Exemplary embodiments are described in terms of solid state drives (SSDs), however the embodiments are not limited to solid state drive systems. Describing the approaches using solid state drives as an example system is not meant to limit the described embodiments to only the physical or electrical interfaces and configurations associated with SSDs. It will be apparent to one of ordinary skill in the art that the approaches described herein may be applicable to any known or future non-volatile, solid-state memory device and sub-systems thereof.

In general, obtaining hard information (1-bit information) is faster and/or cheaper whereas obtaining soft information (multiple information bits) is slower or more expensive. On the other hand, hard information has less information than soft information and therefore has the tendency to fail (not decode correctly) more often. In cases where a page of data is read at one time, it becomes fairly expensive and inefficient to obtain soft information with multiple reference voltages for each bit in the page. By appropriately using a combination of hard and soft information, a smart SSD drive can achieve the high performance (and low cost) associated with hard information and the reliability associated with a soft information. When two separate decoders need to be used: a hard decoder and a soft decoder, the decoder implementation is expensive.

In this disclosure, we propose reusing the existing soft-decision LDPC decoder to also decode hard data from a flash cell.

FIG. 1 illustrates various processes for re-using a soft decoder to decode hard data in a memory device in accordance with various embodiments. The methodology illustrated in FIG. 1 involves receiving 110 soft data and hard data from memory cells in a memory device, mapping 120 the soft data to a first set of soft information, and mapping 130 the hard data to a second set of soft information. Notice that mapping 120 the soft data to a first set of soft information can happen either before or after mapping 130 the hard data to a second set of soft information. The methodology further involves decoding 140 the first set of soft information using a soft decoder and re-using 150 the same soft decoder to decode the second set of soft information. The first and second sets of soft information may comprise information in the form of LLRs.

Figure 2:
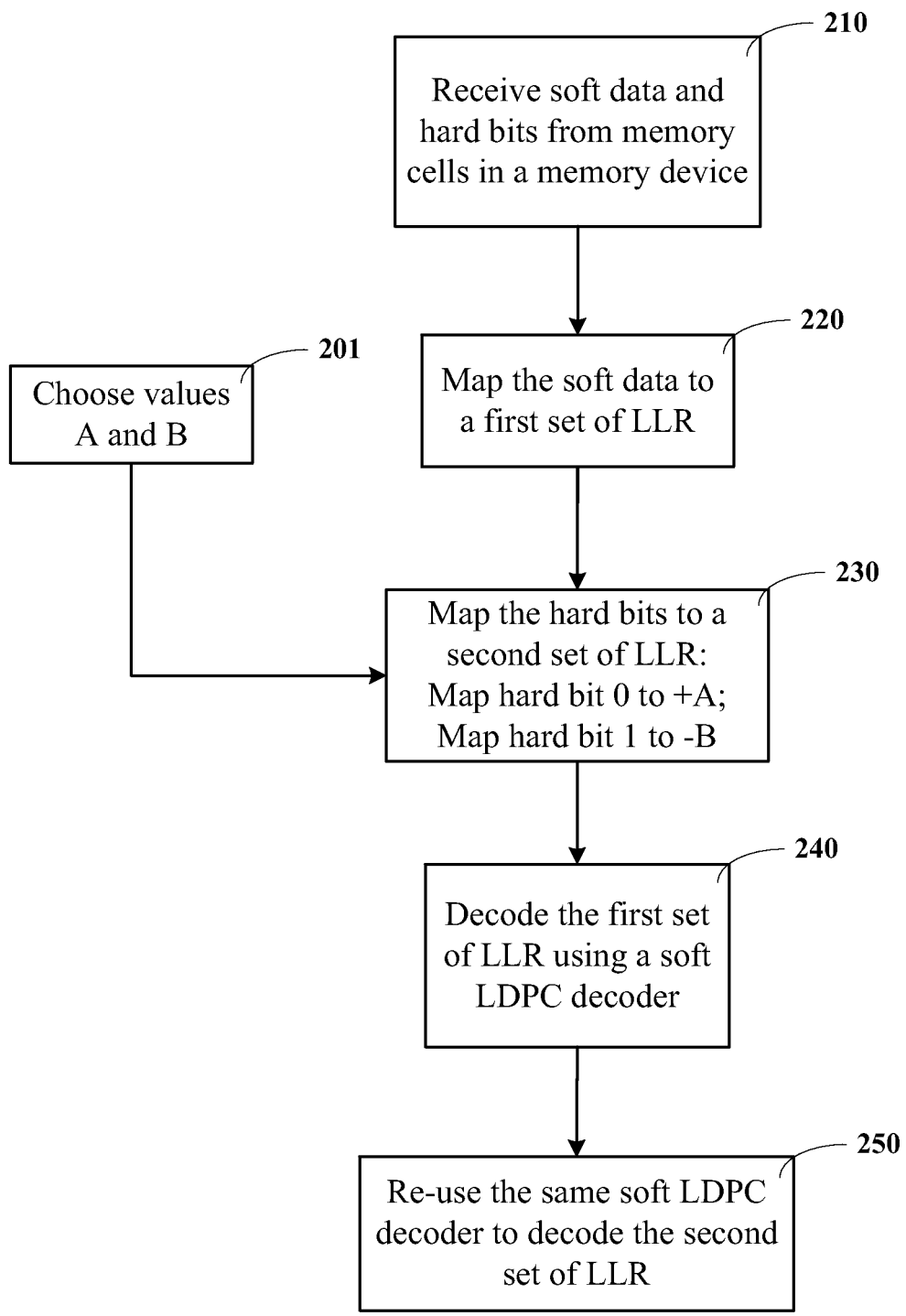
FIG. 2 shows various processes for re-using a soft decoder to decode hard data in a memory device in accordance with other embodiments.

FIG. 2 shows various processes for re-using a soft decoder to decode hard data in a memory device in accordance with other embodiments. The methodology illustrated in FIG. 2 involves receiving 210 soft data and hard data from memory cells in a memory device, wherein the hard data comprises information in the form of bits. The method also includes mapping 220 the soft data to a first set of LLRs, which can happen either before or after mapping 230 the hard bits to a second set of LLRs. For example, the soft data can be mapped to any number of values depending on the number of bits used for LLRs. For the hard bits mapping 230, a bit equal to 0 can be mapped to a "+A" LLR and bit equal to 1 can be mapped to a "−B" LLR, using available noise information. The values +A and −B can be chosen 201 by searching over all possible values that result in the best decoder performance. The value A may or may not be equal to the value B. The method further involves decoding 240 the first set of LLRs using a soft LDPC decoder, and re-using 250 the same soft LDPC decoder to decode the second set of LLRs.

Figure 3:
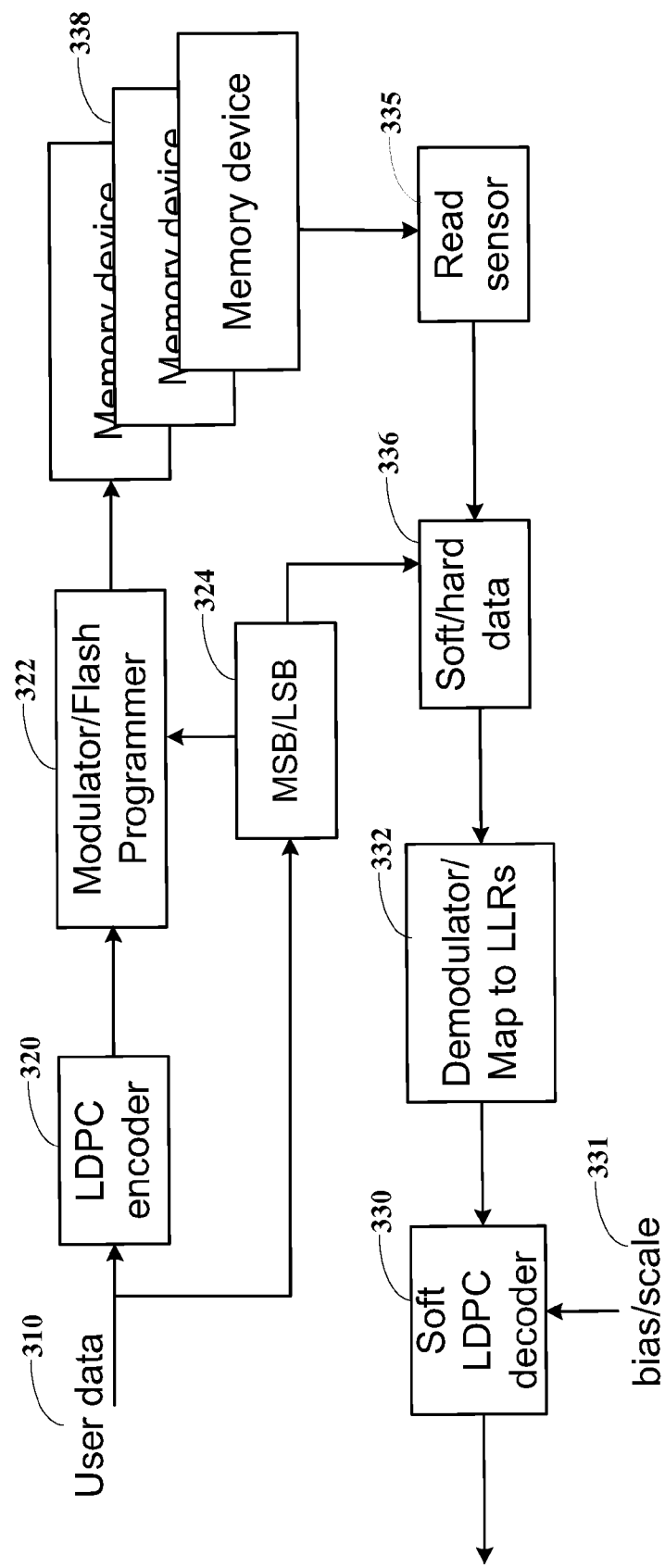
FIGS. 3 and 4 show apparatuses for re-using a soft decoder to decode hard data in a memory device in accordance with various embodiments.

A system using LDPC codes as error control code (ECC) is shown in FIG. 3. In a system (e.g., an SSD drive) as shown in FIG. 3, a page of user data 310 is encoded using an ECC encoder 320, in this case, and LDPC encoder. Some ECC codes can be decoded using soft information. In the example of FIG. 3, the ECC code is an LDPC code, although the approaches discussed herein are applicable to other types of codes. After modulation by a modulator or a flash programmer 322, the modulated signal level is stored in a flash device 338, which could comprise one or more memory devices.

During reading, the stored charge level is estimated through a read sensor 335 that reads data from one page 324 from the memory device 338 and provides either a page of hard or soft data 336 to a demodulator 332. In cases where the memory device 338 includes an MLC device, the page of data read may be a most significant bit (MSB), a least significant bit (LSB) page, or both, in the case of an MLC memory device that stores more than two bits per memory cell, the page read may be an intermediate significant bit (ISB) page. The bits of MSB, LSB, and ISB can come from one same logical page as in full sequence architecture, or can come from different logical pages as in multi page architecture. The data 336 provided by the read sensor 335 could be as little as a single bit of information per memory cell, or multiple bits of information per memory cell could be provided. For example, in an SLC device the read sensor 336 may provide 1-bit information per memory cell to the demodulator 332, indicating whether the stored bit in the memory cell was a 0 or a 1 (hard data), or it could provide multiple bits of information per cell (soft data), indicating the value of the stored charge in the SLC device within a specified range. With only hard data available, the demodulator 332 uses available noise statistics to generate bit level soft-information (e.g., LLR) to a decoder 330, or in some cases as indicated in FIG. 3, a soft LDPC decoder 330. For example, the demodulator 332 can map bit 0 to a "+A" LLR and bit 1 to a "−B" LLR, using available noise information to estimate the probability that the bit value (0 or 1) read is the same bit value that was written to the memory cell. In some cases, the read-sensing reference voltage may be set so that A is equal to B. In some cases, when the read-sensing reference voltage of the read sensor 335 is not optimally set and cannot be changed, it is useful and practical to use available noise information on the signal levels to choose the values of A and B, where A need not be equal to B. In some implementations, search can be performed over a range of values for A and B and the one that results in the best decoder performance can be used. This search can be done once at the time of optimizing the parameters of the SSD drive.

In case soft data 336 is available from the flash, the demodulator 332 uses available noise statistics to generate bit level LLRs for the LDPC decoder 330. The LDPC decoder 330 performs multiple local iterations using the bit level soft information LLR to decode the page read from the memory device. If the received sequence converges to a codeword, iterations stop. In error recovery mode, more iterations can be performed. Programmable bias and scaling parameters 331 can be modified in the soft LDPC decoder to further optimize the soft decoder performance. To improve the performance of the soft LDPC decoder, a (programmable) bias term can be subtracted from the messages from the variable nodes to the check nodes; alternatively, the check node to variable node messages may be scaled by a (programmable) scaling factor. The bias or scaling factors may depend on the channel conditions, page type, demodulator mapping levels A and B.

Figure 4:
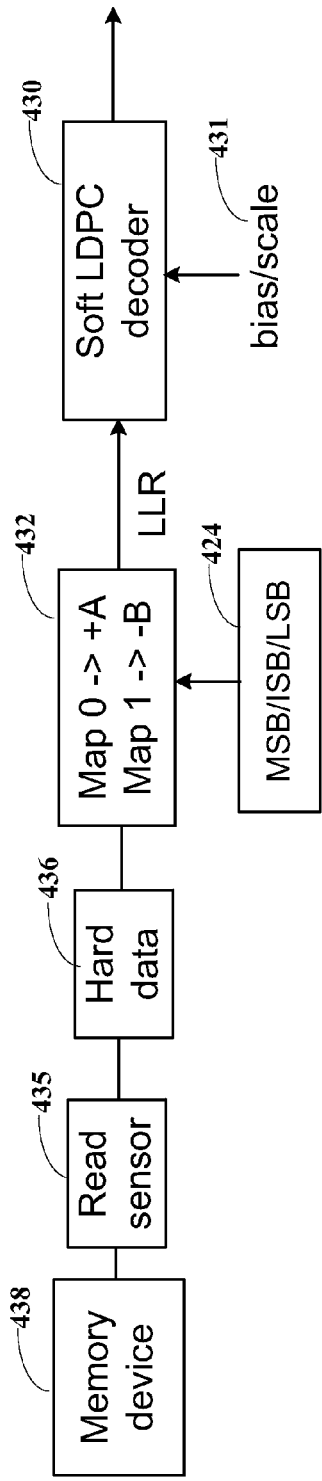

In some implementations, only hard data is available. A high level decoder block diagram is shown in FIG. 4 that involves a system in which only hard data is available. Notice that in FIG. 4, only hard data bits 436 are available from the read sensor 435. The demodulator 432 uses available noise statistics to generate LLRs which are provided to the soft LDPC decoder 430.

When sequential reads of multiple pages are performed or, in some cases, when random reads of multiple pages are performed, MSB, ISB, and LSB pages of a single physical page are read, e.g. one after the other. In these cases, it may be possible to use the decoded information from one of the pages to determine or enhance the soft information generated for the other pages. For any given page, while a second read can be performed to get more soft information on the same given page, one can also use information from other pages to decode the given page.

Figure 5:
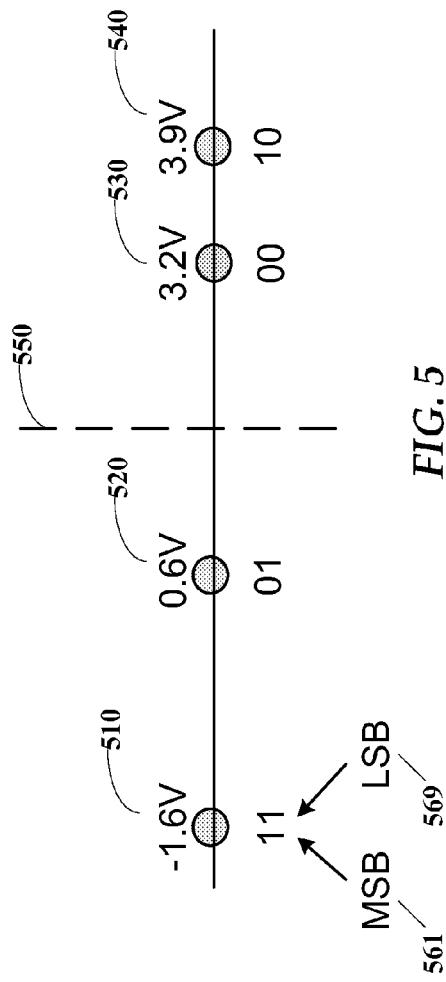
FIG. 5 shows signal points of a 2-bit MLC flash cell according to various example embodiments.

Suppose we have a 2-bit MLC device with the signal levels/points 510-540 as shown in FIG. 5. In such a case, if the MSB page (bits on the left in the two bit symbol, e.g., 561) is decoded first, then the decoded bits for the MSB page can be used to refine the demodulator map (0→A, 1→B) for the LSB page bits at the time of reading. If the MSB page bit (left bit including 561) is a 1, then only two possible signal points 510 and 540 are left for decoding. The new mapping for the LSB page bit can be 0→A', 1→B', where A' and B' are new estimates which can be based on a distance between the read reference voltage 550 and signal points 510 and/or 540, for example. Values A' and B' are not necessarily equal to values A and B, respectively. In this scenario, the mapping for the LSB page may be determined and/or enhanced based on the mapping for the MSB page. This approach can be extended to multiple bits in an m-bit MLC memory device, wherein m can be larger than or equal to three.

Figure 6:
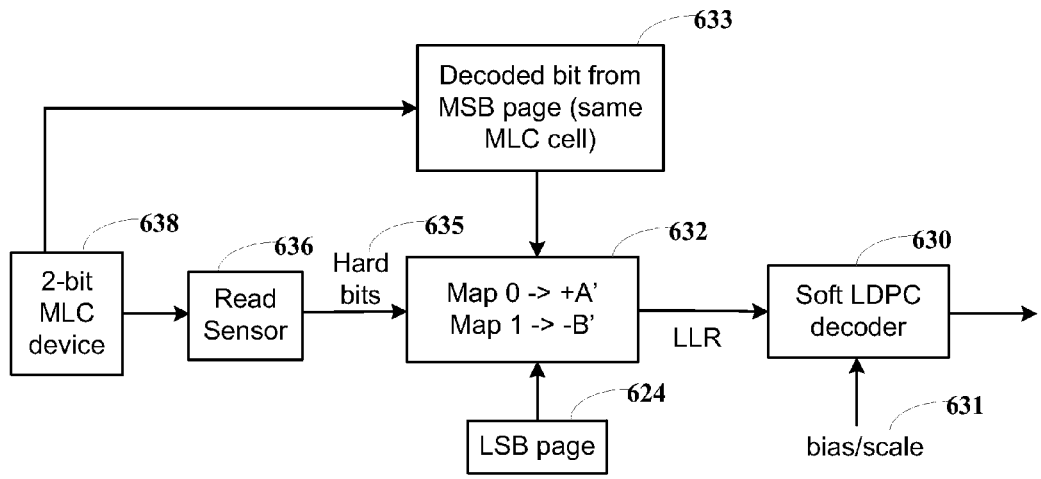
FIGS. 6, 7, and 8 show apparatuses for re-using a soft decoder to decode hard data from a multi-bit MLC in a memory device in accordance with various embodiments.

A decoder block diagram configured to use decoded information from one page to determine and/or enhance the mapping of another page is shown in FIG. 6. The read sensor 636 provides hard bits of information to the demodulator 632. In this implementation, information of the decoded bit 633 from MSB (even) page of the 2-bit MLC device 638, can be used to refine the mapping in the demodulator 632 for the LSB (odd) page 624. The LDPC decoder 630 performs multiple local iterations using the bit level soft information LLR to decode the page read from the memory device. If the received sequence converges to a codeword, iterations stop. In error recovery mode, more iterations can be performed. Programmable bias and scaling parameters 631 can be modified in the soft LDPC decoder to further optimize the soft decoder performance.

Figure 7:
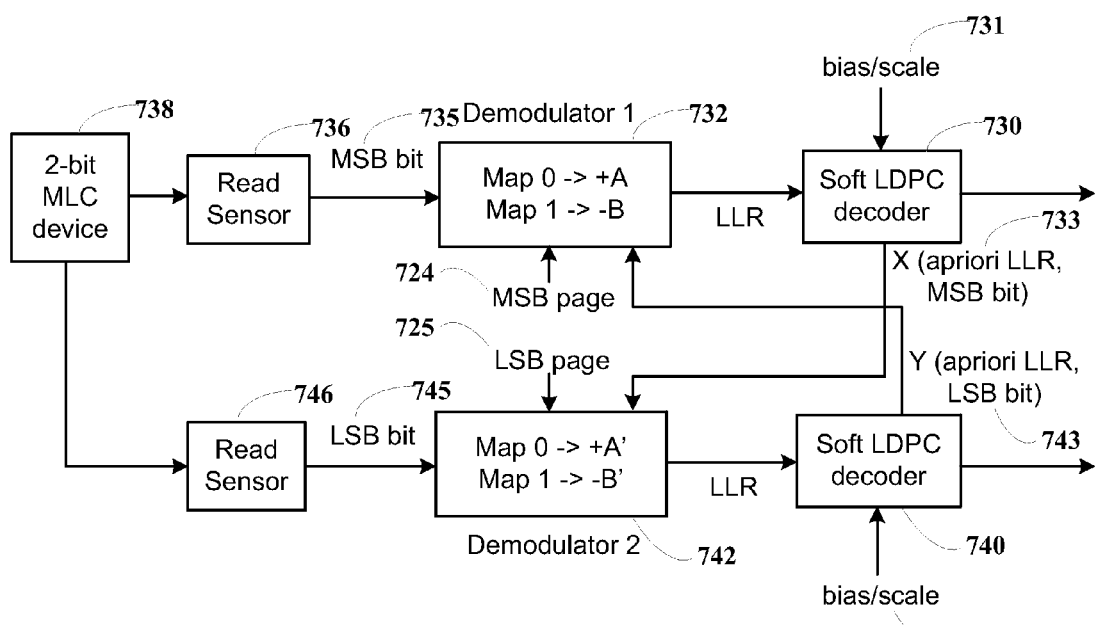

Furthermore, in the special case wherein sequential reads are performed (or random reads of a sufficient large number of bytes, e.g. larger than 4K bytes, of both MSB (even) and LSB (odd) logical pages for a 2-bit MLC flash drive, the MSB and LSB pages may be decoded jointly by using global iterations between the soft LDPC decoder for the LSB page and the soft LDPC decoder for the MSB page. FIG. 7 shows block diagram of an apparatus for jointly decoding the two pages via global iterations between the LDPC decoders (730 and 740) and the demodulators (732 and 742).

The soft information or a priori LLR 733 corresponding to a bit from the MSB-page 724 can be used to refine the mapping of 0→A and 1→B in the demodulator 742 for the LSB page 725, and vice versa. Note that the 2-bit MLC flash device 738 is not re-read, but rather the soft-information generated during LDPC decoding of one page is used to assist the mapping of bits to LLRs for the other page on a bit-by-bit basis (since 2-bit MLC stores one odd (LSB) page bit and one even (MSB) page bit). This operation can be done in error-recovery mode in the event that the mode involves more time to decode than an on-the-fly read operation. Both global iterations between LDPC decoder and demodulator blocks and local iterations within LDPC decoder can be performed in this case. Optimal values for the programmable bias and scaling parameters (731 and 741) can be determined in the soft LDPC decoders (730 and 740).

Figure 8:
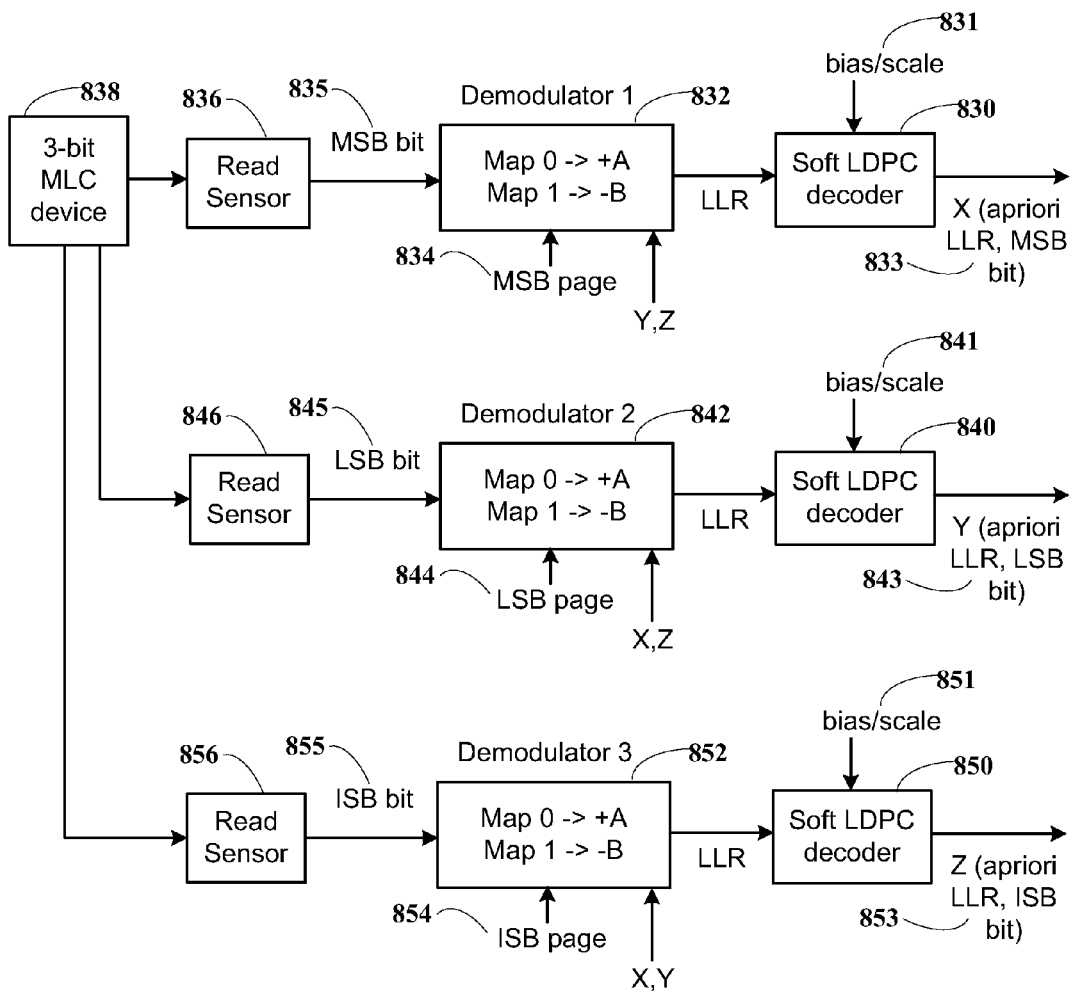

FIG. 8 generalizes the method and apparatus in FIG. 7 to those involving a joint decoding from a 3-bit MLC flash device 838. Compared to the block diagram in FIG. 7, the diagram FIG. 8 includes one more branch of decoding ISB bit, and global iterations among three LDPC decoders (830, 840, and 850) and three demodulators (832, 842, and 852) in general.

The soft information or a priori LLRs X and Y (833 and 843) corresponding to bits from MSB and LSB pages (834 and 844) can be used to refine the mapping of 0→A and 1→B in the demodulator 852 for the ISB page 854, and similar operations can happen to refine the mapping in the other demodulators 832 and 842. While FIG. 8 illustrates all the possible cases of joint decoding, it is not necessary for one demodulator to use a priori LLRs from all the other pages to refine its mapping. Note that the 3-bit MLC flash device 838 is not re-read, but rather the soft-information generated during LDPC decoding of one page is used to assist the mapping of bits to LLRs for other pages on a bit-by-bit basis. This operation can be done in error-recovery mode in the event that the mode involves more time to decode than an on-the-fly read operation. Both global iterations between LDPC decoder and demodulator blocks and local iterations within LDPC decoder can be performed in this case. Optimal values for the programmable bias and scaling parameters (831, 841, and 851) can be determined in the soft LDPC decoders (830, 840, and 850). Further generalizations can be done to involve a similar joint decoding from an m-bit MLC memory device, wherein m can be larger than or equal to three.

Figure 9:
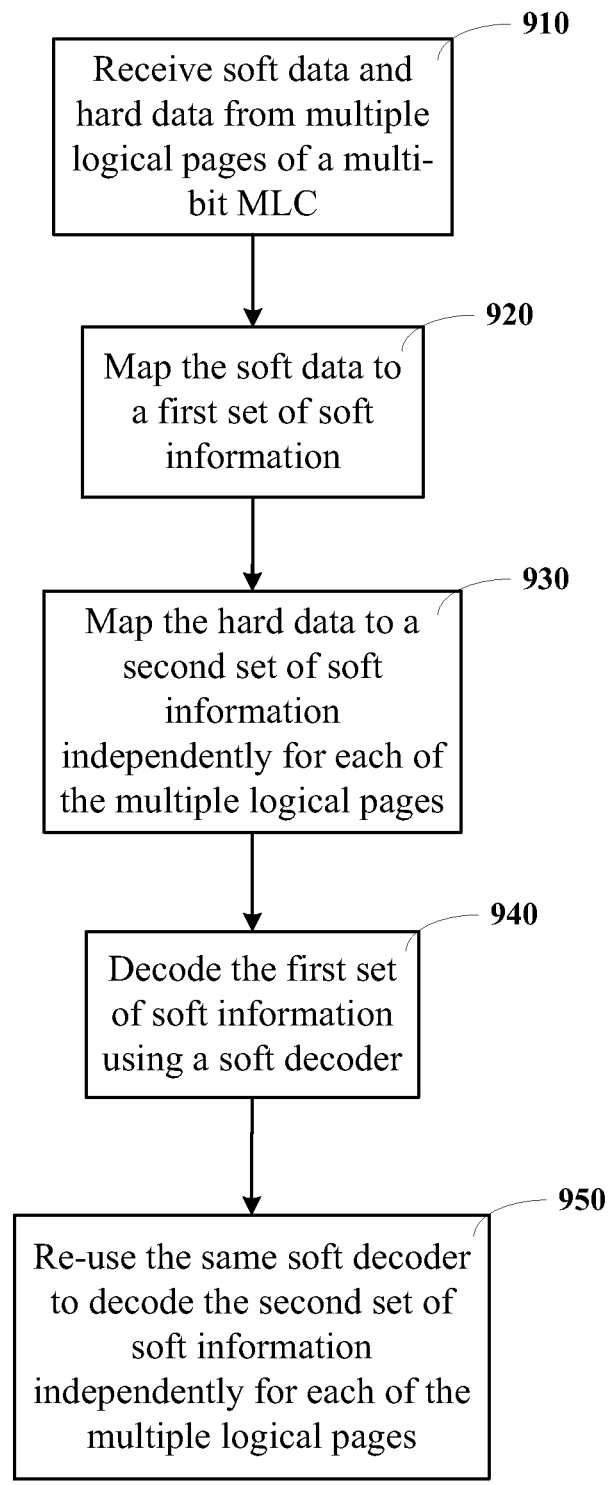
FIGS. 9 and 10 show various processes for re-using a soft decoder to decode hard data from a multi-bit MLC in a memory device according to various embodiments.

In accordance with various embodiments, a method for re-using a soft decoder to decode hard data from a multi-bit MLC in a memory device is shown in FIG. 9. The method comprises receiving 910 soft data and hard data from multiple logical pages of a multi-bit MLC in a memory device. The hard data is read sequentially or randomly from the multiple logical pages. The method also includes mapping 920 the soft data to a first set of soft information either before or after mapping 930 the hard data to a second set of soft information, wherein the hard data is mapped 930 independently for each of the multiple logical pages. The method further includes decoding 940 the first set of soft information using a soft decoder and re-using 950 the same soft decoder to decode the second set of soft information. Again, the second set of soft information is decoded independently for each of the multiple logical pages.

Figure 10:
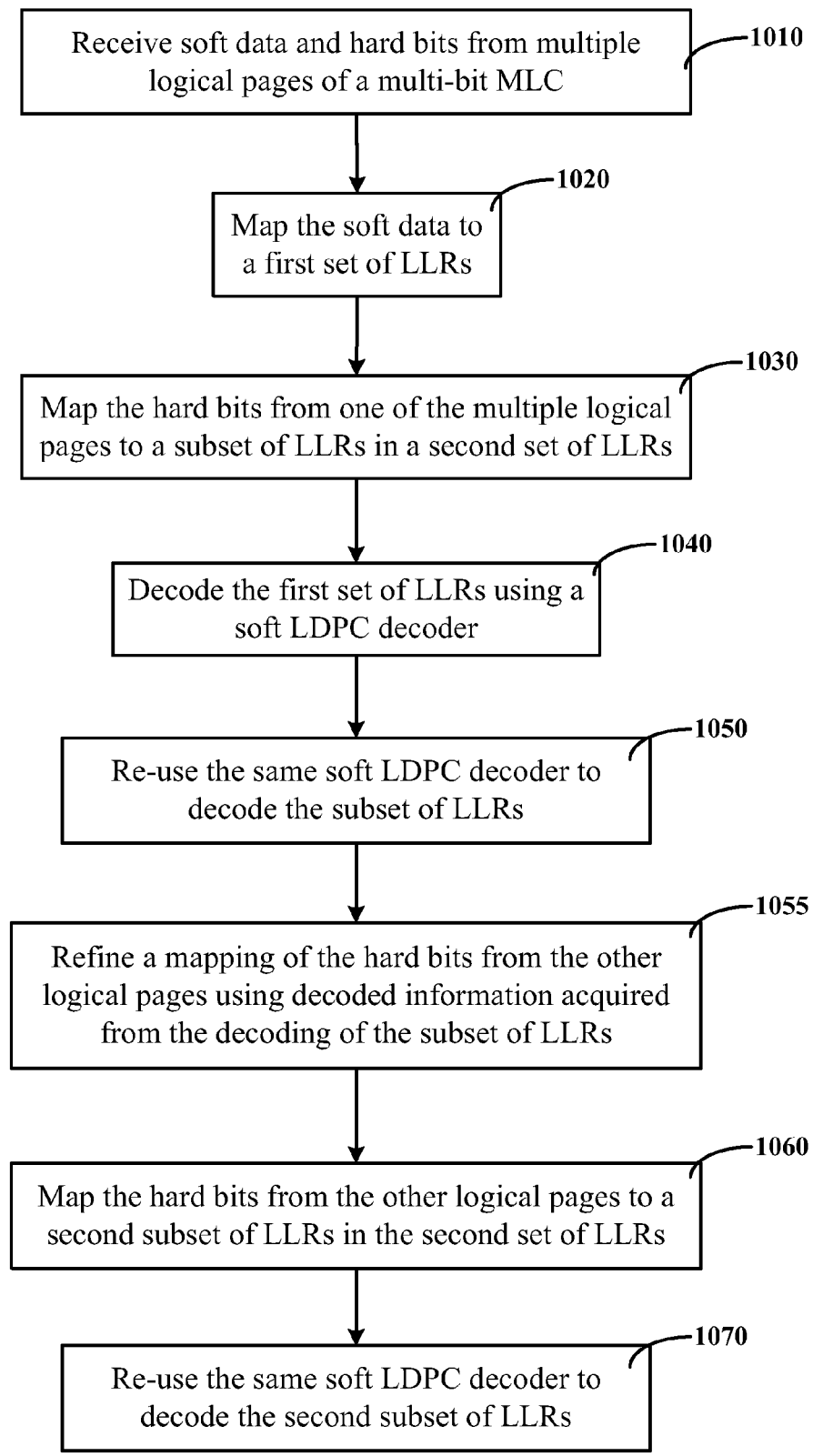

FIG. 10 shows various processes for re-using a soft decoder to decode hard data from a multi-bit MLC in a memory device according to some embodiments. The method includes receiving 1010 soft data and hard bits from multiple logical pages of a multi-bit MLC. The soft data is mapped 1020 to a first set of LLRs. The hard bits from one of the multiple logical pages, e.g. the MSB page, are mapped 1030 to a subset of LLRs in a second set of LLRs. The first set of LLRs is decoded 1040 using a soft LDPC decoder. The same soft LDPC decoder is re-used 1050 to decode the subset of LLRs for the MSB page. A mapping of the hard data from one or more other logical pages, e.g. the LSB page, is refined 1055 using decoded information acquired from the decoding of the subset of LLRs from the MSB page. The hard bits from the LSB page are mapped 1060 to a second subset of LLRs. The same soft LDPC decoder is re-used 1070 to decode the second subset of LLR. Note that steps 1050, 1055, and 1060 can be performed iteratively until a given criteria is met.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. A method, comprising:
   receiving soft data and hard data from memory cells in a memory device;
   mapping the soft data to a first set of soft information;
   mapping the hard data to a second set of soft information comprising mapping a bit 0 to +A and mapping a bit 1 to −B; and
   decoding the first set of soft information and the second set of soft information using a soft decoder, wherein values A and B are chosen by searching over a specified range of values and selecting the values for A and B based on the soft decoder performance.

2. The method of claim 1, wherein the first and second sets of soft information comprise log-likelihood ratios (LLRs).

3. The method of claim 1, wherein the hard data comprises a bit of information and mapping the hard data to the second set of soft information comprises using available noise information to map the bit of information to multiple bits that include the hard data and confidence information.

4. The method of claim 1, wherein the values A and B are chosen by selecting the values A and B that provide optimal soft decoder performance.

5. The method of claim 1, wherein values A and B are chosen one time during an optimization process for the soft decoder.

6. The method of claim 1, wherein mapping the hard data to the second set of soft information comprises using information in a look-up table.

7. The method of claim 1, wherein mapping the hard data to the second set of soft information is based on a distance between a read reference voltage at least one signal point.

8. The method of claim 1, wherein the memory device and the soft decoder are components of a solid state drive (SSD).

9. A method, comprising:
receiving soft data and hard data from multi-level memory cells (MLCs) in a memory device, the MLCs arranged so that each MLC contains at least one bit of multiple logical pages;
mapping the soft data to a first set of soft information;
mapping the hard data to a second set of soft information; and
decoding the first set of soft information and the second set of soft information using a soft decoder, wherein mapping the hard data to the second set of soft information and decoding the second set of soft information using the soft decoder comprises:
decoding a first logical page; and
using decoded information from the first logical page to refine mapping hard information of a second logical page.

10. A method, comprising:
receiving soft data and hard data from multi-level memory cells (MLCs) in a memory device, the MLCs arranged so that each MLC contains at least one bit of multiple logical pages;
mapping the soft data to a first set of soft information;
mapping the hard data to a second set of soft information; and
decoding the first set of soft information and the second set of soft information using a soft decoder, wherein mapping the hard data to the second set of soft information and decoding the second set of soft information using the soft decoder comprises:
jointly decoding the multiple logical pages;
using information from the joint decoding to refine the mapping of a page of the multiple logical pages.

11. An apparatus, comprising:
a memory device including memory cells;
a read sensor configured to receive soft data and hard data from the memory cells;
a demodulator configured to map the soft data to a first set of soft information, and to map the hard data to a second set of soft information, wherein mapping the hard data includes mapping bit 0 to +A and mapping bit 1 to −B; and
a soft decoder configured to decode the first set and second set of soft information, wherein values A and B are chosen by searching over a specified range of values and selecting the values for A and B that provide optimal soft decoder performance.

12. The apparatus of claim 11, wherein the first and second sets of soft information comprise information of log-likelihood ratio (LLR).

13. The apparatus of claim 11, wherein the soft decoder is and Low Density Parity Check decoder.

14. An apparatus comprising:
a memory device including memory cells;
a read sensor configured to receive soft data and hard data from the memory cells;
a demodulator configured to map the soft data to a first set of soft information, and to map the hard data to a second set of soft information, wherein mapping the hard data includes mapping bit 0 to +A and mapping bit 1 to −B; and
a soft decoder configured to decode the first set and second set of soft information, wherein:
the memory device comprises multilevel memory cells (MLCs) each memory cell capable of storing n bits, where n >2, the MLCs arranged so that each MLC contains at least one bit of multiple logical pages;
the demodulator is configured to use decoder information from a first page to refine the mapping of a second page of the MLCs.

15. An apparatus, comprising:
a memory device including memory cells;
a read sensor configured to receive soft data and hard data from the memory cells;
a demodulator configured to map the soft data to a first set of soft information, and to map the hard data to a second set of soft information, wherein mapping the hard data includes mapping bit 0 to +A and mapping bit 1 to −B; and
a soft decoder configured to decode the first set and second set of soft information, wherein:
the memory device comprises multilevel memory cells (MLCs), the MLCs arranged so that each MLC contains at least one bit of multiple logical pages;
the decoder is configured to jointly decode multiple logical pages;
the demodulator is configured to use information from the joint decoding to refine the mapping of a page of the multiple logical pages.

* * * * *